(12) United States Patent
Fabry

(10) Patent No.: US 7,852,652 B1
(45) Date of Patent: Dec. 14, 2010

(54) MATCH LINE PRECHARGE CIRCUITS AND METHODS FOR CONTENT ADDRESSABLE MEMORY (CAM) DEVICE

(75) Inventor: Martin Fabry, Mountain View, CA (US)

(73) Assignee: Netlogic Microsystems, Inc., Santa Clara, CA (US)

( * ) Notice: Subject to any disclaimer, the term of this patent is extended or adjusted under 35 U.S.C. 154(b) by 161 days.

(21) Appl. No.: 12/215,748

(22) Filed: Jun. 27, 2008

Related U.S. Application Data

(60) Provisional application No. 60/937,826, filed on Jun. 29, 2007.

(51) Int. Cl.
*G11C 15/04* (2006.01)
(52) U.S. Cl. ............... 365/49.17; 365/49.1; 365/49.11; 365/49.16; 365/203
(58) Field of Classification Search ............... 365/49.1, 365/49.11, 49.16, 49.17, 203
See application file for complete search history.

(56) References Cited

U.S. PATENT DOCUMENTS 5,970,007 A * 10/1999 Shiratake ................ 365/207
6,804,133 B1 * 10/2004 Khanna ................ 365/49.15
6,972,978 B1 * 12/2005 Miller et al. ............ 365/49.16
2002/0196648 A1 * 12/2002 Gordon et al. ............ 365/49
2004/0114411 A1 * 6/2004 Noda et al. .............. 365/49

* cited by examiner

*Primary Examiner*—Hoai V Ho
*Assistant Examiner*—Jay Radke
(74) *Attorney, Agent, or Firm*—Haverstock & Owens, LLP

(57) ABSTRACT

A content addressable memory (CAM) device can include a number of match lines, each coupled to a plurality of CAM cells. The CAM device also includes one or more one precharge circuits. Such a precharge circuit can have a first precharge path that couples a match line to a precharge voltage node in response the activation of a first control signal, and a second precharge path that couples the match line to the precharge voltage node in response to the activation of a second control signal. Prior to a compare operation leakage current through the CAM cells can prevented by disabling the precharge paths and isolating the CAM cells from a reference voltage (e.g., ground). The second control signal can be activated after the first control signal in a compare operation.

16 Claims, 6 Drawing Sheets

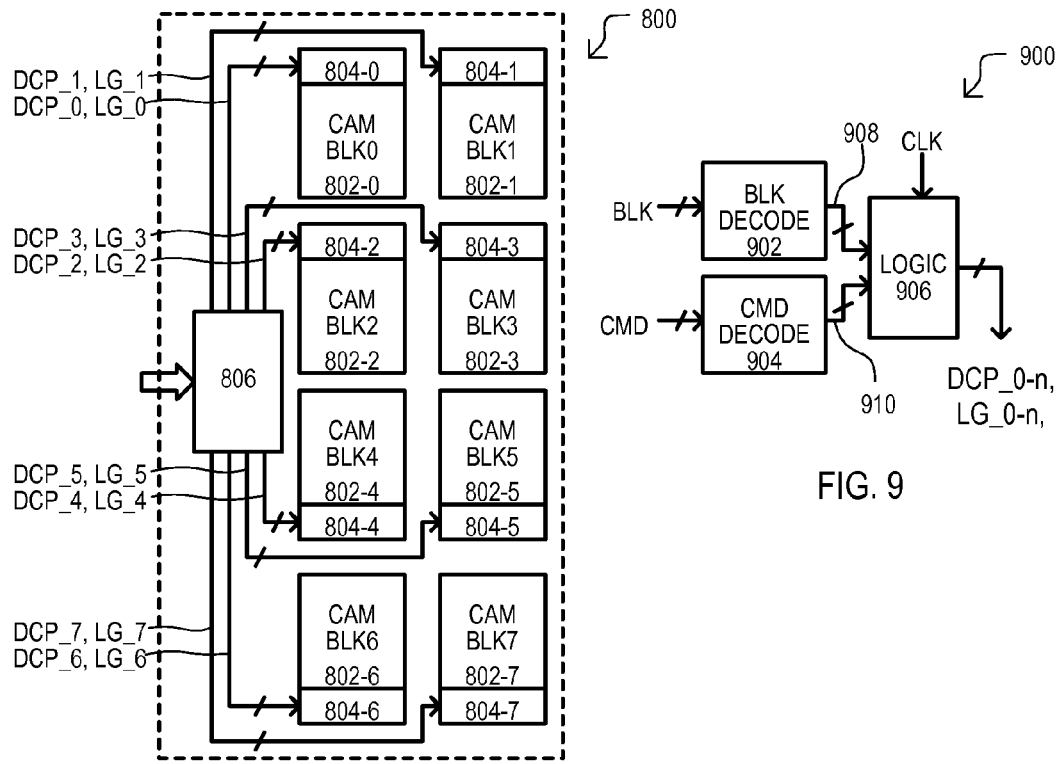
FIG. 8
FIG. 9
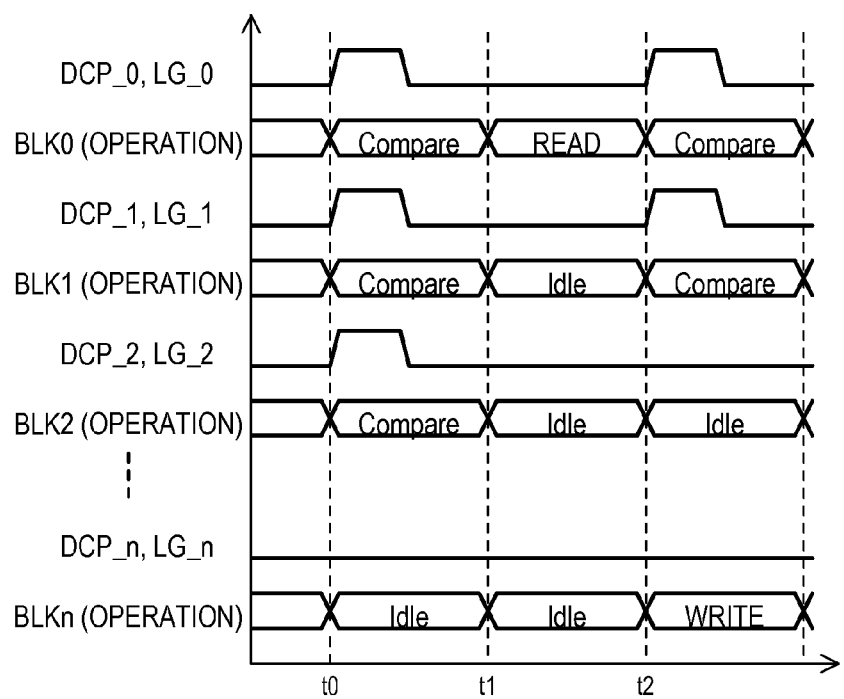
FIG. 10

MATCH LINE PRECHARGE CIRCUITS AND METHODS FOR CONTENT ADDRESSABLE MEMORY (CAM) DEVICE

This application claims the benefit of U.S. Provisional Patent Application Ser. No. 60/937,826 filed on Jun. 29, 2007, the contents of which are incorporated by reference herein.

TECHNICAL FIELD

The present invention relates generally to content addressable memory (CAM) devices, and more particularly to CAM devices having match lines that can switch from one potential to another in response to the application of compare data to CAM cells connected to the match lines.

BACKGROUND OF THE INVENTION

Content addressable memory (CAM) devices, sometimes referred to as "associative memories," can receive a compare data value (sometimes referred to as a comparand or search key), and compare such a value against a number of stored data values. In most configurations, such an operation can match a compare data value against a very larger number of stored data values (e.g., thousands or millions), essentially simultaneously.

Such rapid compare functions have resulted in CAM devices enjoying wide application in various packet processing hardware devices, such as routers and network switches, to name just two. In a typical packet processing operation, a device can receive a packet. The packet can include a "header" that includes various data fields that indicate how the packet should be processed. The hardware device can use a matching function, provided by a CAM device, to compare one or more header fields to stored data values that can indicate how the packet is to be processed.

Many CAM device configurations can include a number of CAM memory cells arranged in a logical fashion (e.g., rows, words, etc.) to store data values for comparison with a search key. Such CAM memory cells typically include a storage circuit for storing one or more bit values as well as a compare circuit for comparing the stored data value(s) with corresponding portions of a received search key.

CAM devices are typically manufactured in integrated circuit form, as stand alone memory devices, or as some portion of an integrated circuit providing other functions. For many integrated circuit applications, including those that include CAM memory cells, current draw can be an important feature. That is, it is desirable to reduce current draw in an integrated circuit to as great an extent as possible.

To better understand various aspects of the present invention, a known CAM device circuit will briefly be described.

Referring now to FIG. 12, an example of a CAM device is shown in a block schematic diagram and designated by the general reference character 1200. A CAM device 1200 can include a match line 1202, a precharge circuit 1204 and a discharge node 1206. FIG. 12 also shows circuits equivalent to CAM cells situated in parallel with one another between match line 1202 and discharge node 1206. In the example shown, such equivalent circuits can include two n-channel metal-oxide-semiconductor (MOS) transistors having source-drain paths arranged in series with one another. It is understood that each equivalent circuit can represent all or a portion of (i.e., a leg) of a compare "stack" within a CAM cell.

A match line 1202 can provide a match indication in a compare operation. In particular, a match line 1202 can be precharged to a high power supply voltage VDD by precharge circuit 1204. In the event received compare data values are determined not to match data values stored in corresponding CAM cells, one or more CAM cells can provide a low impedance path between match line 1202 and discharge node 1206. In contrast, in the event received compare data values are determined to match data values stored in corresponding CAM cells, the CAM cells can all maintain high impedance paths between match line 1202 and discharge node 1206, maintaining match line 1202 at the precharged level.

In FIG. 12, precharge circuit 1204 can include an "AC" precharge p-channel MOS (PMOS) transistor P120 and a "DC" precharge PMOS transistor P122. Transistor P120 can have source-drain path connected between a high power supply voltage VDD and match line 1202, and a gate connected to receive precharge signal /PC. Precharge signal /PC can be activated (go low in this example) in response to a compare operation. This can ensure a match line 1202 is at a precharge level prior to the application of compare data. DC precharge transistor P122 can have source-drain path connected between a high power supply voltage VDD and match line 1202, in parallel with that of transistor P120, and can have a gate connected to a low power supply voltage VSS. In this arrangement, transistor P122 can be an "always on" transistor.

While CAM cells would ideally provide complete electrical isolation between a match line 1202 and discharge node 1206 in all but the mismatch case, in most cases a compare stack for each CAM cell can draw some amount of leakage current. Leakage currents for CAM cells are thus shown in FIG. 12 as Ieff0 to Ieffn. In such an arrangement, it is understood that CAM cells can draw a total leakage current that is the sum of Ieff0 to Ieffn, or a saturation current of DC precharge transistor P122.

U.S. Pat. No. 6,804,133 issued to Sandeep Khanna on Oct. 12, 2004 shows, among other matters, a match line control circuit that can adjust the charge current for a match in response to a valid bit and a pre-charge signal.

BRIEF DESCRIPTION OF THE DRAWINGS

FIG. 8 is a top plan view of a CAM device according to an embodiment of the invention.

FIG. 9 shows a signal generation circuit that can be included in the embodiment of FIG. 8.

FIG. 10 is a timing diagram showing operations of a CAM device like that FIGS. 8 and/or 9.

DETAILED DESCRIPTION

Various embodiments of the present invention will now be described in detail with reference to a number of drawings. The embodiments include a content addressable memory (CAM) device having precharge and isolation circuits that can place CAM cells into a low current state, and methods for controlling the precharging of one or more match lines of a CAM device.

Figure 1:
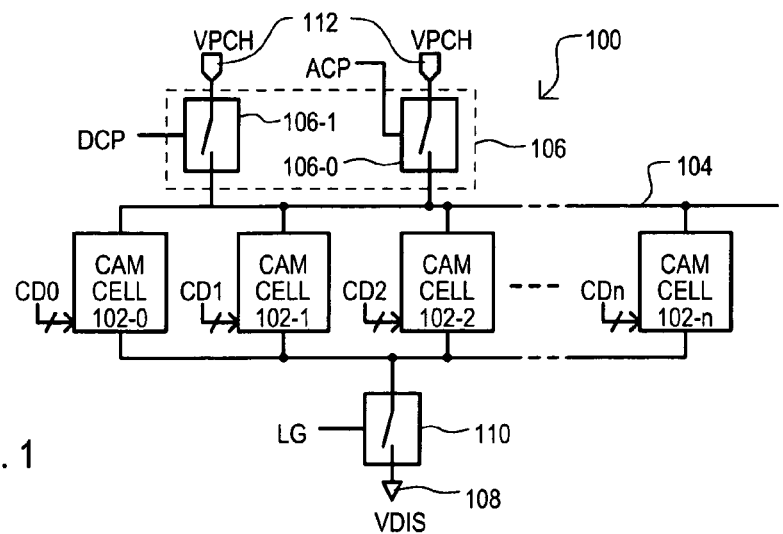
FIG. 1 is a block schematic diagram of a content addressable memory (CAM) device according to a first embodiment of the invention.

Referring now to FIG. 1, a CAM device according to a first embodiment is shown in a block schematic diagram and designated by the general reference character 100. A CAM device 100 can include a number of CAM cells 102-0 and 102-n, a match line 104, a precharge circuit 106, a reference node 108, an isolation circuit 110, and a precharge node 112. CAM cells (102-0 and 102-n) can generate a match indication on match line 104 in response to received compare data (CD0 to CDn). In the particular example shown, CAM cells (102-0 and 102-n) can be arranged in parallel with one another between match line 104 and isolation circuit 110. Each CAM cell (102-0 and 102-n) can store one or more data values for comparison with received compare data values (CD0 to CDn). Data values stored by CAM cells (102-0 and 102-1) can include data and/or mask data. In a compare operation, compare data and be compared against data stored in the CAM cells (102-0 and 102-1). Mask data can force one type of compare indication (e.g., match or mismatch) regardless of a received compare data value.

Precharge circuit 106 can provide one or more precharge paths between a precharge node 112 and match line 104. Unlike conventional arrangements, a precharge circuit 106 can initially isolate a match line 104 from a precharge node 112, thus reducing leakage current through CAM cells (102-0 to 102-n). In response to a compare operation, a precharge circuit 106 can initially provide a first precharge path, and then subsequently provide a second precharge path. In the very particular example of FIG. 1, a precharge circuit 106 can include a first switch device 106-0 and a second switch device 106-1. A first switch device 106-0 can selectively provide a current path between precharge node 112 and match line 104 according to a first control signal ACP. A second switch device 106-1 can selectively provide a current path between precharge node 112 and match line 104 according to a second control signal DCP.

According to control signals ACP and DCP, current paths in both first and second switch devices (106-0 and 106-1) can be disabled at the same time (e.g., placed into a high impedance state) to isolate match line 104 from precharge node 112. In addition, a current path of one switch device (106-0 or 106-1) can be enabled (e.g., placed into a low impedance state) to provide a current path of a first impedance (or current) configuration. Still further, a current path of the other switch device (106-1 or 106-0), or of both such switch devices, can be enabled to provide a current path of a second impedance (or current) configuration. In one particular arrangement, a first switch device 106-0 can enable a current path having a lower impedance (or greater current supply rate) than that of second switch device 106-1.

Isolation circuit 110 can selectively isolate CAM cells (102-0 to 102-n) from a reference node 108 in response to an isolation signal LG. This can also reduce leakage through CAM cells (102-0 to 102-n). For example, an isolation circuit 110 can initially isolate CAM cells (102-0 to 102-n) from a reference node 108 thus substantially reducing leakage current through such CAM cells (assuming isolation circuit 110 itself has a lower leakage current than that of all the CAM cells). In response to a compare operation, an isolation circuit 110 can connect CAM cells (102-0 to 102-n) to reference node 108. This can enable CAM cells (102-0 to 102-n) to generate a match indication on match line 104 by enabling or preventing a relatively large current path between match line 104 and reference node 108.

In this way, a CAM device can include a precharge circuit that can isolate a match line from a precharge node, and then selectively connect the match line to the precharge node by one or more current paths. In addition, or alternatively, a CAM device can include an isolation circuit that isolates match lines from a reference potential, and then connects them to the reference potential in the event a compare operation is to be executed.

Various examples of possible operations for the embodiment shown in FIG. 1 will now be described with reference to FIG. 2.

Figure 2:
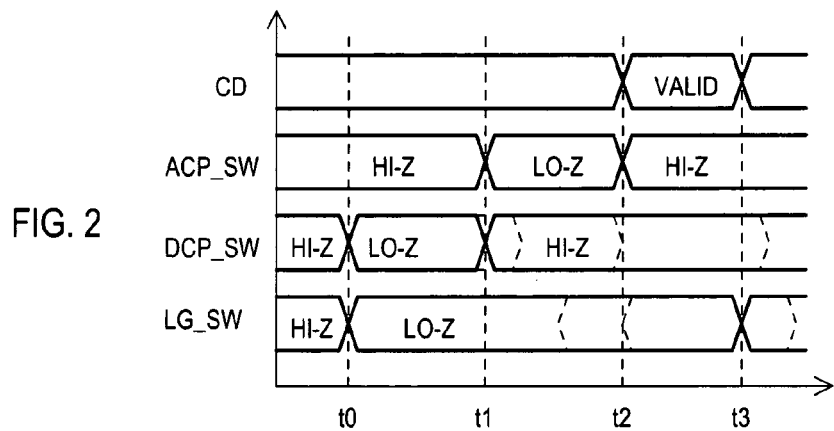
FIG. 2 is a timing diagram showing operations of the CAM device shown in FIG. 1.

Referring now to FIG. 2, a timing diagram shows various examples of compare operations for a CAM device 100 like that of FIG. 1. Compare operations can include applying compare data to CAM cells (102-0 to 102-n) in order to generate a match indication on a match line 104. FIG. 2 shows a number of waveforms, including waveform CD, which can indicate when applied compare data is valid (and hence can result in the generation of a match indication). Waveforms ACP_SW shows a state of a first switch device 106-0. Waveform DCP_SW shows a state of a second switch device 106-1. Waveform LG_SW shows a state of an isolation circuit 110.

Prior to time t0, compare data CD is not valid, and thus cannot generate a valid match result on a match line 104. First switch device 106-0, second switch device 106-1, and isolation circuit 110 can all be in high impedance states. This can result in reduced current leakage through CAM cells (102-0 to 102-n).

At about time t0, compare data CD is still not yet valid. First switch device 106-0 remains in a high impedance state. However, second switch device 106-1 can switch from a high impedance state to a low impedance state. As a result, a match line 104 can charge to, or toward a precharge voltage VPCH at precharge node 112. In this way, one precharge switch can be enabled prior to another.

In the example shown, isolation circuit 110 can also switch to a low impedance state at about time t0. As a result, reference node 108 can be pulled to, or toward a reference voltage VDIS. However, as understood from dashed portions of waveform LG_SW, in other embodiments, an isolation circuit 110 can switch from a high to low impedance state prior to, or coincident with compare data values being valid (at about time t2).

At about time t1, compare data CD remains invalid. However, first switch device 106-0 can switch from a high impedance state to a low impedance state. Preferably, such an operation can essentially ensure match line 104 is at a potential suitable for detecting a match result (e.g., at or about VPCH). In the example shown, second switch device 106-1 can return to a high impedance state at about time t1. However, as understood from dashed portions of waveform DCP_SW, in other embodiments, an isolation circuit 110 can switch from a low to high impedance state at a later time, including after compare data are no longer valid (after time t3).

Prior to, or at about time t2, first switch device 106-0 can return to a high impedance state. This can allow match line 104 to either remain at or about a precharge voltage VPCH.

At about time t2, or shortly thereafter, compare data CD can be valid. As a result, depending upon compare operations within CAM cells (102-0 to 102-n), match line 104 can stay at precharge voltage VPCH (or thereabout), or be pulled toward reference voltage VDIS.

At about time t3, compare data CD can no longer be valid. At this time, or some time thereafter, first switch device 106-0, second switch device 106-1, and isolation circuit 110 can all return to high impedance states.

In this way, a precharge circuit can isolate match line from a precharge voltage to provide a low leakage state. In response to a compare operation, the match line can be connected to the precharge voltage by sequential precharge paths of different impedances (or current supplying rates).

Figure 3:
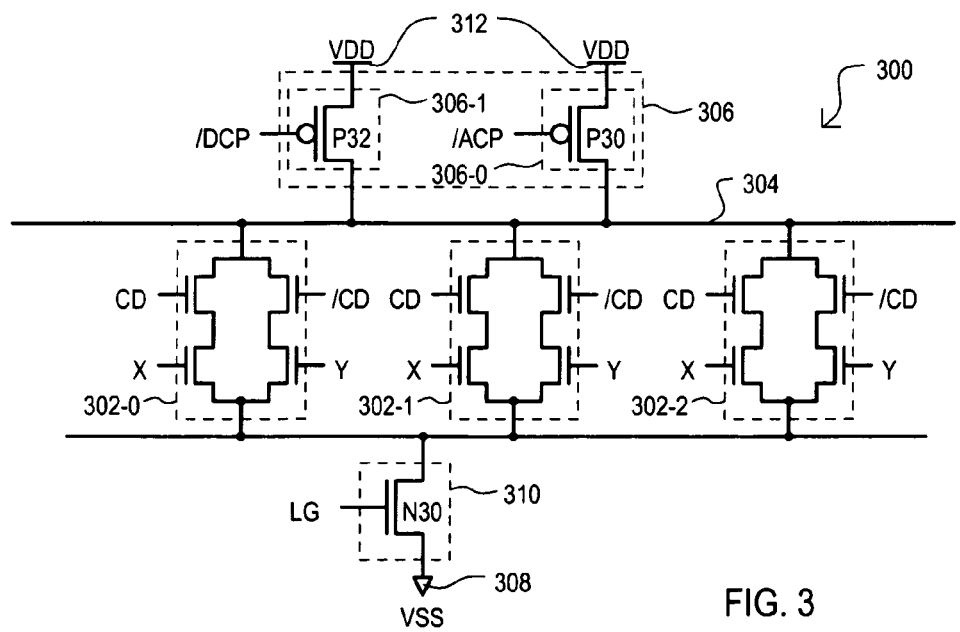
FIG. 3 is a schematic diagram of a CAM device according to another embodiment of the invention.

Referring now to FIG. 3, a CAM device according to another embodiment is shown in schematic diagram and designated by the general reference character 300. A CAM device 300 can include some of the same general sections as FIG. 1, thus like sections are referred to by the same reference character but with the first digit being a "3" instead of a "1". FIG. 3 shows a row of CAM cell compare stacks (302-0 to 302-2) and associated precharge/isolation circuitry. However, such a structure can be repeated numerous times. Further, a precharge circuit 306 can be shared among multiple match lines (e.g., 304) and/or an isolation circuit 310 can be shared among multiple reference nodes (e.g., 308).

In the arrangement of FIG. 3, CAM cells can be "XY" type CAM cells. Thus, compare stacks (302-0 to 302-2) can include two legs, each having two transistors with source-drain paths in series with one another between match line 304 and isolation circuit 310. One leg can be enabled or disabled (provide or not provide a current path) according to a first stored data value "X" and a compare data signal CD, while the other leg can be enabled or disabled according to a second stored data value "Y" and a compare data signal /CD. Such an arrangement can provide a relatively compact cell/stack structure, and allow for isolation to occur via compare data signals CD, /CD. However, other embodiments can include CAM cells having different types of compare stacks, thus the particular compare stack structures shown in FIG. 3 should not necessarily be construed as limiting to the invention to any particular CAM cell configuration.

Referring still to FIG. 3, in the precharge circuit 306 of the arrangement shown, a first switch circuit 306-0 can include a p-channel insulated gate field effect transistor (IGFET) P30 having a source-drain path connected between match line 304 and a precharge node 312, which in this example can be maintained at a high power supply voltage VDD. A gate of transistor P30 can receive a control signal /ACP. A second switch device 306-1 can also be a p-channel IGFET P32 having a source-drain path connected between match line 304 and a precharge node 312. Transistor P32 can be controlled by a second control signal /DCP. Transistor P32 can have a smaller current supplying capability than transistor P30. As but one example, transistor P32 can have a lower saturation current than transistor P30.

In the arrangement of FIG. 3, an isolation circuit 310 can include an n-channel IGFET N30 having a source-drain path connected between compare stacks (302-0 to 302-2) and a reference node 308, which in this case can be maintained at a low power supply voltage.

Having described the construction of one particular embodiment in FIG. 3, operations for such an embodiment will now be described.

Figure 4:
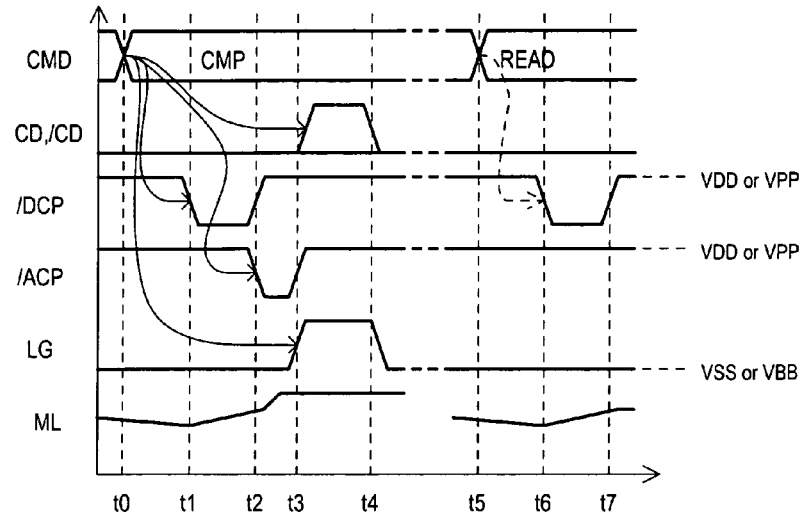
FIG. 4 is a timing diagram showing an operation of the CAM device shown in FIG. 3.

Referring now to FIG. 4, a timing diagram shows operations for the embodiment of FIG. 3. In FIG. 4, a waveform CMD can represent the reception of a particular command by a CAM device 300. Waveform CD, /CD can represent compare data signals received by CAM cell compare stacks (302-0 to 302-2). A waveform ML shows one very particular example of the potential of a match line 304.

FIG. 4 also shows signal /ACP that can control first switch device 306-0 and signal /DCP that can control second switch device 306-1. Signals /ACP and/or /DCP can vary between an active level (in this case a low power supply voltage VSS) and an inactive level. In one particular embodiment, either or both of signals /ACP and /DCP can have an inactive level at a high power supply voltage VDD. Alternatively, either or both of signals /ACP and /DCP can have an inactive level higher than a high power supply voltage VDD, shown in this example as VPP.

Referring still to FIG. 4, signal LG is shown that can control isolation circuit 310. As in the case of signals /ACP and /DCP, signal LG can vary between an active level (in this case a high power supply voltage VDD) and an inactive level. In one particular embodiment, an inactive level for signal LG can be a low power supply voltage VSS. Alternatively, signal LG can have an inactive level lower than a low power supply voltage VSS, shown in this example as VBB.

Referring now to FIG. 4 in conjunction with FIG. 3, at about time t0, a command can be received that indicates a compare operation is to take place. At this time, compare data values CD,/CD can be low, placing the compare stacks (302-0 to 302-2) into high impedance states. Signals /ACP, /DCP and LG can all be at inactive levels, further reducing leakage current paths to/from compare stacks (302-0 to 302-2).

At about time t1, compare data values CD,/CD have not yet transitioned in response to the compare command, and so remain low. However, signal /DCP does transition to an active state in response to the compare command. As a result, a match line potential ML can be driven to, or toward a precharge voltage (in this case VDD) at a first rate, determined by a channel size of transistor P32. Signals /ACP and LG remain inactive at this time.

At about time t2, compare data values CD,/CD still have not yet transitioned in response to the compare command, and so remain low. However, at about this time, signal /ACP can transition to an active state. As a result, a match line potential ML can be driven to, or toward a precharge voltage (in this case VDD) at a second rate, determined by a channel size of transistor P30. In the particular example of FIG. 4, signal /DCP can transition to an inactive level at this time. Signal LG can remain inactive.

At about time t3, signal /ACP can return to an inactive level, thus ending a precharge operation for a match line 304. In the example of FIG. 4, signal LG can transition to an active level at this time. However, in alternate arrangements, signal LG can transition to an active level earlier in time.

At about time t3, compare data values CD,/CD can switch states in response to received compare data values. In particular, for each CAM cell, one received compare data value can transition high according to a particular compare data bit value. In the example of FIG. 4, a compare operation results in a "match" result. Therefore, a match line potential ML can remain at about the precharge level.

A second operation is shown in FIG. 4 starting at time t5.

At about time t5, a non-compare command can be received. A non-compare command can be a command that does not require a match line to be precharged, and in this example is a read command. Because the command is a non-compare command, compare data values CD,/CD can remain low. In addition, signals /ACP and LG can remain inactive throughout the operation.

At about time t6, in response to a non-search command, signal /DCP can transition to an active state. As a result, a match line 304 can be precharged to, or toward precharge voltage VDD.

In this way, in response to a compare command, a CAM device can dynamically precharge a match line utilizing multiple precharge devices. However, in response to a non-compare command, the CAM device can dynamically precharge a match line utilizing one precharge device.

While the above embodiments have shown particular types of precharge circuits, other embodiments can include precharge circuits having different structure types. A few examples of such alternate embodiments will now be described.

Figures 5A, 5B:
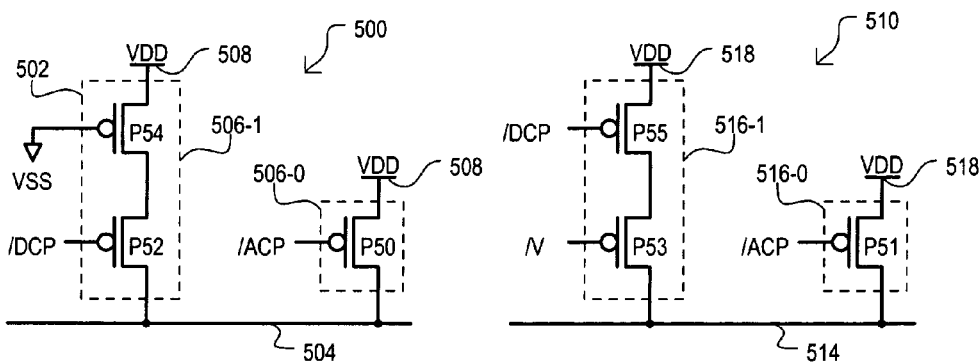
FIGS. 5A to 5D are schematic diagrams of precharge circuits that can be included in embodiments of the invention.

Referring now to FIG. 5A, precharge circuit according to an embodiment is shown in a schematic diagram and designated by the general reference character 500. A precharge circuit 500 can be connected to a match line 504. A match line 504 can be connected to a number of CAM cells (not shown in FIG. 5A to avoid unduly cluttering the view).

A precharge circuit 500 can include a first switch circuit 506-0 and a second switch circuit 506-1. A first switch circuit 506-0 can be essentially the same as that shown as 306-0 in FIG. 3.

A second switch circuit 506-1 can include a dynamic device P52 in series with a static device P54. A dynamic device P52 can provide a precharge path in response to a signal /DCP as in the embodiment of FIG. 3. A static device P54 can be an "always on" device that can provide a precharge path regardless of any control signal. In one very particular arrangement, a static device P54 can serve as a current limiting device, by restricting the amount of current that can be drawn by dynamic device P52. In the very particular example of FIG. 5A, both static and dynamic devices (P52 and P54) can be p-channel IGFETs. Transistor P54 can have a source-drain path connected to a precharge node 508, which can receive a high power supply voltage, and a gate connected to receive a low power supply voltage VSS. Transistor P52 can have a source-drain path connected between that of transistor P54 and match line 504. Transistor P52 can receive a control signal /DCP at its gate. Signal /DCP can operate as shown in FIG. 4, and equivalents.

In this way, a second switching circuit can include both a static device and a dynamic device arranged in series with one another.

Referring now to FIG. 5B, a precharge circuit according to another embodiment is shown in a schematic diagram and designated by the general reference character 510. A precharge circuit 510 can include some of the same general sections as FIG. 5A, thus like sections are referred to by the same reference character but with the first two digits being a "51" instead of "50".

Precharge circuit 510 can differ from that of FIG. 5A in that a second switch circuit can include a valid enable device P53 in series with a dynamic device P55. A valid enable device P53 can provide a precharge path based on a valid value N. A valid value /V can indicate whether or not the CAM cells connected to match line 514 store valid data. A dynamic device P55 can provide a precharge path in response to a signal /DCP as in the embodiment of FIG. 3

In the very particular example of FIG. 5B, both devices P53 and P55 can be p-channel IGFETs. Transistor P55 can have a source-drain path connected to a precharge node 518, which can receive a high power supply voltage, and a gate connected to receive a control signal /DCP at its gate. Signal /DCP can operate as shown in FIG. 4, and equivalents. Transistor P53 can have a source-drain path connected between that of transistor P55 and match line 504. Transistor P53 can receive a valid value N at its gate. In such an arrangement valid value N can be low, when CAM cells connected to match line 514 store valid data.

Figures 5C, 5D:
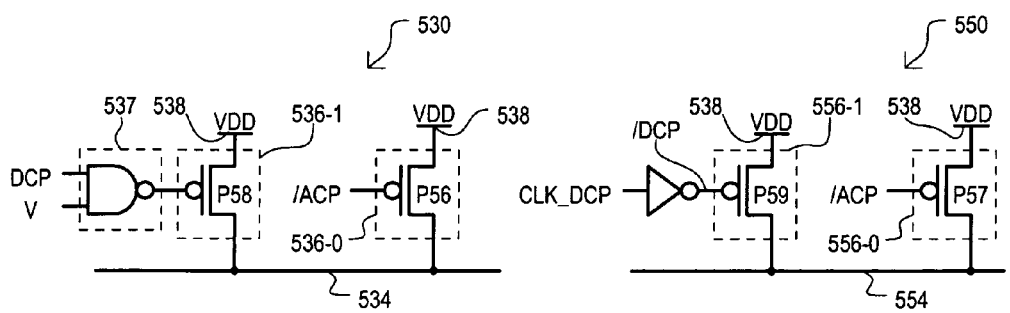

Referring now to FIG. 5C, a precharge circuit according to another embodiment is shown in a schematic diagram and designated by the general reference character 530. A precharge circuit 530 can include some of the same general sections as FIG. 5B, thus like sections are referred to by the same reference character but with the first two digits being a "53" instead of a "51".

Precharge circuit 530 can differ from that of FIG. 5B in that a second switch circuit 536-1 can include a single dynamic device P58 rather than series connected device. Dynamic device P58 can be enabled (e.g., provide a relatively low impedance) or disabled (e.g., provide a relatively high impedance) in response to an output signal generated by a logic circuit 537. In the particular example of FIG. 5C, dynamic device P58 can be a p-channel IGFET having a source-drain path connected between a precharge node 532 and match line 534, and a gate connected to logic circuit 537.

Logic circuit 537 can receive both a dynamic control signal DCP, as well as a valid indication V. If control signal DCP is active, and valid indication V indicates that data stored by CAM cells connected to match line 534 are valid, then dynamic device P58 can be enabled. In the very particular of FIG. 5C, a control signal DCP can be active when at a logic high and valid indication V can indicate valid data when at a logic high. Logic circuit 537 can be a NAND gate. Of course, the particular signaling convention and logic circuit shown should not be construed as limiting to the invention.

In this way, a second switching circuit can be enabled by both a dynamic signal and a valid value. In such an arrangement a match line connected to CAM cells storing invalid data can be prevented from being precharged by way of a second switch circuit. This can avoid wasting charge current on invalid CAM entries.

Referring now to FIG. 5D, a precharge circuit according to yet another embodiment is shown in a schematic diagram and designated by the general reference character 550. A precharge circuit 550 can include some of the same general sections as FIG. 5C, thus like sections are referred to by the same reference character but with the first two digits being a "55" instead of a "53".

Precharge circuit 550 can differ from that of FIG. 5C in that a single dynamic device P59 within second switch circuit 556-1 can be controlled by a periodic clock signal CLK_DCP. Thus, regardless of operation type, a match line 554 can be periodically precharged by second switch circuit 556-1. This is in contrast to a first switch device 556-0, which in the arrangement of FIG. 5D can be enabled in response to a compare operation, and disabled otherwise.

In this way, a second switching circuit can be periodically enabled to keep a match line at or near a precharge potential.

While embodiments of the invention can include particular CAM devices and/or precharge circuits, other embodiments can include CAM device architectures. One such example is shown in FIG. 6.

Figure 6:
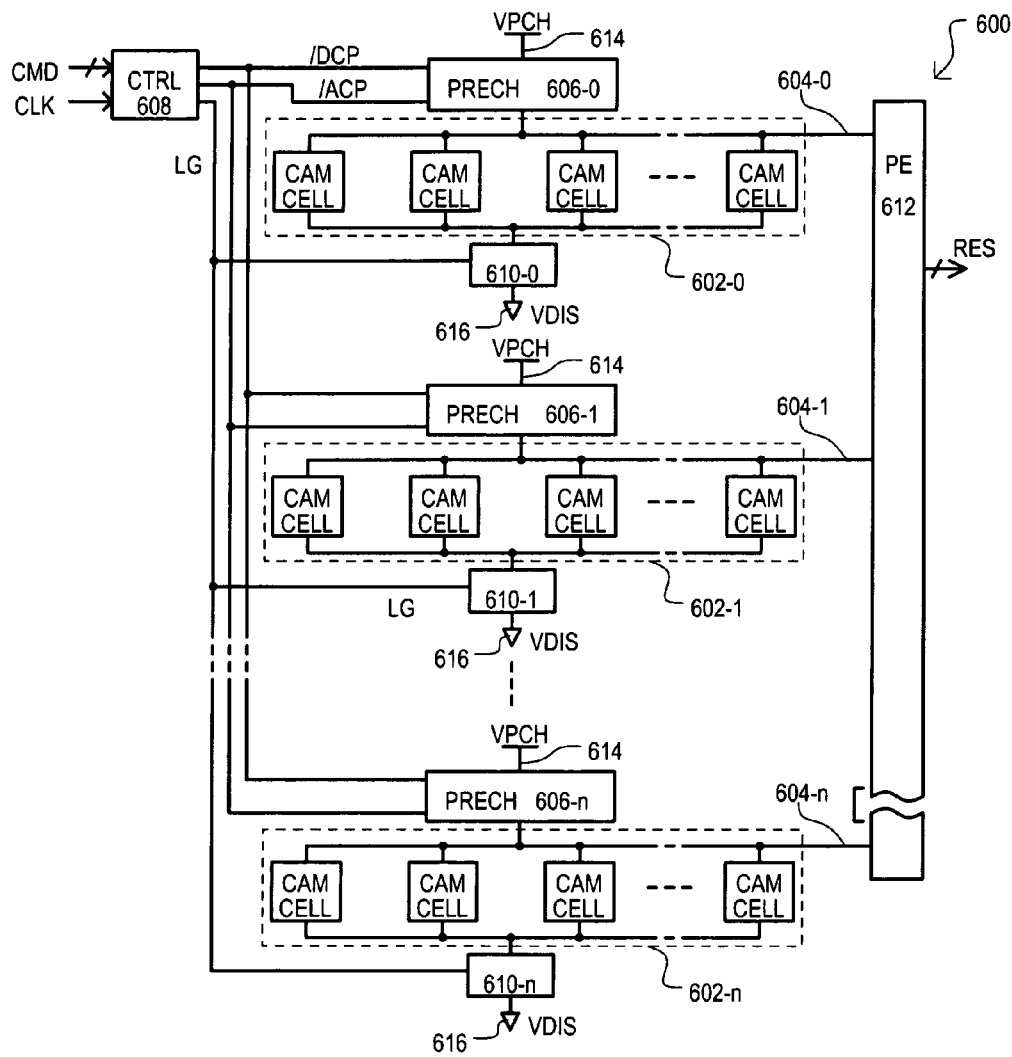
FIG. 6 shows a block schematic diagram of a CAM device according to another embodiment or the invention.

Referring now to FIG. 6, a CAM device according to one embodiment is shown in a block schematic diagram and designated by the general reference character 600. A CAM device 600 can include a number of CAM cell groups 602-0 to 602-n, match lines 604-0 to 604-n associated with each CAM cell group, precharge circuits 606-0 to 606-n associated with each match line, a control section 608, isolation circuits 610-0 to 610-n associated with each CAM cell group, and a prioritizing section 612. CAM cells of each group can be connected to bit lines, word lines, and row decoders, which are not shown in order to avoid unduly cluttering the view. CAM cells can include both ternary and/or binary CAM cells, as but two examples. According to an applied compare data values, CAM cells of the same group 602-0 to 602-*n* can generate a match indication on the corresponding match line 604-0 to 604-*n*, respectively.

In the particular example of FIG. 6, match lines (604-0 to 604-*n*) can provide compare results to a prioritizing section 612, which can prioritize from among multiple match results, to generate a "winning" result value RES. Each match line (604-0 to 604-*n*) can be connected to, or isolated from a precharge node 614 by a corresponding precharge circuit (606-0 to 606-*n*).

A control section 608 can generate control signals /ACP, /DCP, LG in response to received input data. In the particular example shown, a control section 608 can receive command data CMD and timing data CLK. Command data CMD can indicate a type of operation to be executed by a CAM device, including but not limited to: reads, compares, writes, learns. Timing data CLK can be a periodic signal generated from an external timing source, or internal timing circuit, as but two examples. In one very particular example, signals /ACP, /DCP and LG can be activated in response to a compare operation. More particularly, signal /DCP can be activated prior to the activation of signal /ACP, while signal LG can be activated prior to, concurrent with, or after the activation of signal /ACP.

Each precharge circuit (606-0 to 606-*n*) can take the form of those shown by the various embodiments, or equivalents. In the particular example shown, each precharge circuit (606-0 to 606-*n*) can operate in response to a first control signal /ACP and a second control signal /DCP. Such control signals (/ACP and /DCP) can cause a precharge circuit (606-0 to 606-*n*) to isolate a corresponding match line (604-0 to 604-*n*) from a precharge node 614, and then provide two different current supply configurations in response to a compare operation.

Each isolation circuit (610-0 to 610-*n*) can take the form of those shown by the various embodiments, or equivalents. In the particular example shown, each isolation circuit (610-0 to 610-*n*) can operate in response to an isolation signal LG, which can cause an isolation circuit (606-0 to 606-*n*) to isolate its corresponding match line (604-0 to 604-*n*) from a discharge node 616 and enable a current supply to such a node in response to a compare operation.

In this way, a CAM device can isolate match lines from a precharge potential and/or a discharge potential prior to a compare operation to limit current flow through CAM cells of the device. Then, in response to a compare operation, varying current paths to the precharge potential can be enabled and/or a current path to the discharge potential can be enabled.

As noted above, in some embodiments a control signal /DCP or isolation signal LG may have levels outside of that of provided power supply voltages. Two examples of circuits for generating such boosted signals are shown in block schematic diagrams in FIGS. 7A and 7B.

Figures 7A, 7B:
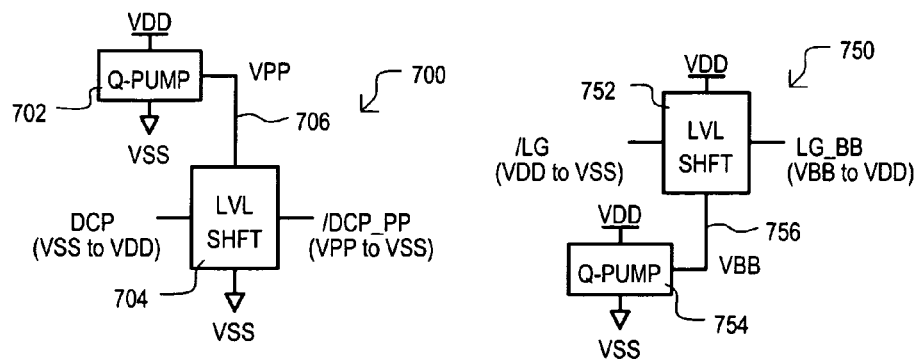
FIGS. 7A and 7B show signal generation circuits that can be included in the embodiments.

Referring now to FIG. 7A a signal generating circuit 700 can include a charge pump circuit 702 and a level shifting circuit 704. A charge pump circuit 702 can operate between a high power supply voltage VDD and a low power supply voltage VSS, and can charge a boost supply node 706 to a voltage VPP that is above a high power supply voltage VDD. Such a charging operation can be in response to single event (clock pulse), or a continuous input (oscillating signal). A resulting boosted voltage VPP can be provided as an input to level shifting circuit 704.

Level shifting circuit 704 can receive an input signal DCP that can vary between supply voltage levels (VDD and VSS), and in response, generate a signal /DCP_PP that varies between a boosted level (VPP) and a supply level (VSS).

While a level shifting circuit 704 can be inverting, alternate arrangements can include non-inverting level shifting circuits.

Referring now to FIG. 7B a second type signal generating circuit 750 can also include a charge pump circuit 752 and a level shifting circuit 754. Unlike the arrangement of FIG. 7A, charge pump circuit 752 can charge a boost supply node 756 to a voltage VBB that is below a low power supply voltage VSS. Boosted voltage VBB can be provided as an input to level shifting circuit 754.

Level shifting circuit 754 can operate in a like fashion as 704 of FIG. 7A, but can generate a signal that varies between VDD and VBB.

While embodiments above have shown arrangements in which one group of CAM cells can be collectively isolated from a match line precharge potential and/or a discharge potential, according to other embodiments, a CAM device can provide such functions on a block-by-block basis. In such an arrangement, those CAM blocks to which compare operations are not directed can continue to isolate their respective CAM cells from a precharge and/or discharge potential. At the same time, those CAM blocks to which a search is directed can provide varying precharge current paths and/or controlled discharge path according to the arrangements described herein, and equivalents. Examples of such block-by-block operations will now be described with reference to FIGS. 8 to 10.

Referring now to FIG. 8, a CAM device is shown in a top plan view, and designated by the general reference character 800. A CAM device 800 can include a number of different blocks, each having its own set CAM cells, corresponding match lines, and circuits for executing compare operations as well as non-compare operations (e.g., reads, writes). Other elements of a CAM device well known by those skilled in the art have been excluded from FIG. 8 to avoid unduly cluttering the view.

The particular CAM device 800 of FIG. 8 shows an arrangement with eight blocks 802-0 to 802-7, but the particular number of blocks should not necessarily be construed as limiting to the invention. Each CAM block (802-0 to 802-7) can include precharge and/or isolation circuits 804-0 to 804-7 according to any of the embodiments or equivalents. Each precharge and/or isolation circuit (804-0 to 804-7) can be controlled by corresponding control signals, including signals /DCP_0 to /DCP_7 and signals LG_0 to LG_n.

A control circuit 806 can activate or deactivate each of control signals /DCP_0 to /DCP_7 and LG_0 to LG_n separately, and according to the type of operation being executed by each CAM block (802-0 to 802-7).

In this way, blocks of a CAM device can include CAM cells that are initially isolated from a match line precharge voltage and/or discharge voltage. In response to a compare operation, match lines for such CAM blocks can be selectively connected to such voltages based upon which CAM blocks are executing compare operations.

Referring now to FIG. 9, a block signal generator circuit that can be included in a control circuit, like that shown as 806 of FIG. 8, is shown in a block schematic diagram, and designated by the general reference character 900. A block signal generator 900 can include a block decode circuit 902, a command decode circuit 904, and logic circuit 906. A block decode circuit 902 can receive a value BLK that can indicate one or more blocks of CAM device, and in response to such a value, can generate block activation signals 908.

A command decode circuit 904 can receive command data CMD, and in response thereto, generate command values 910.

A logic circuit 906 can receive block activation signals 908, command values 910 and a timing signal CLK, an in response thereto, generate, for each block, a control signal /DCP_0 to /DCP_n and an isolation signal LG_0 to LG_n. For example, if a block activation signal indicates a compare operation is executed in the block, the corresponding control signal and isolation signal for the block can be activated. More particularly, if a block select signal is active and the corresponding command value indicates a compare operation, a control signal for the block (e.g., /DCP_n) can be activated to enable match line precharge, and the isolation signal for the block (e.g., LG_n) can be activated, to enable a discharge path for CAM cells in the block.

Optionally, if the command value indicates the operation is not a compare operation, a control signal and isolation signal for the block can remain inactive.

Referring now to FIG. 10, one example of accesses to a multi-bank CAM device is shown in a timing diagram. FIG. 10 shows waveforms specific to each of blocks 0 to n of a CAM device. A waveform BLKi (OPERATION) indicates a type of operation occurring in CAM block i (where i is any of 0 to n). Waveforms DCP_0 to DCP_n show control signals for each block that can enable a precharge path to match lines of such a block. It is understood that each such precharge path operates in conjunction with one or more other precharge paths, enabled according to different timing (e.g., enabled by signals ACP_0 to ACP_n (not shown)). Waveforms LG_0 to LG_n show isolation signals for each block that can enable a discharge path for CAM cells of such a block.

At about time t0, compare operations can be executed in CAM blocks 0 to 2, while CAM block n is in an idle state. As a result, signals DCP_0, DCP_1 and DCP_2 are activated, enabling a first type charge path for match lines within such blocks. In addition, signals LG_0, LG_1 and LG_2 are enabled, providing a discharge path for CAM cells within corresponding blocks. In contrast, signal DCP_n and LG_n remain inactive, resulting in a CAM cells of BLKn being placed in a reduced current leakage configuration.

At about time t1, a read operation can be executed in CAM block 0, while the remaining illustrated CAM blocks can be in idle states. As a result, all of signals DCP_0 to DCP_n and LG_0 to LG_n can all be inactive.

At about time t2, compare operations can be executed in CAM blocks 0 and 1, CAM block 2 can be idle, and CAM block n can be subject to a write operation. As a result, control signals DCP_0 and DCP_1 and isolation signals LG_0 and LG_1 can be activated, while signals DCP_2, DCP_n, LG_2 and LG_n are inactive.

It is noted that while FIG. 10 shows block control for both control signals and isolation signals, other embodiments can include block control for only one type of signal (only DCP_0 to DCP_n or only LG_0 to LG_n).

In this way, precharge operations and/or isolation operations can be executed on a block-by-block basis in a CAM device.

Figure 11A:
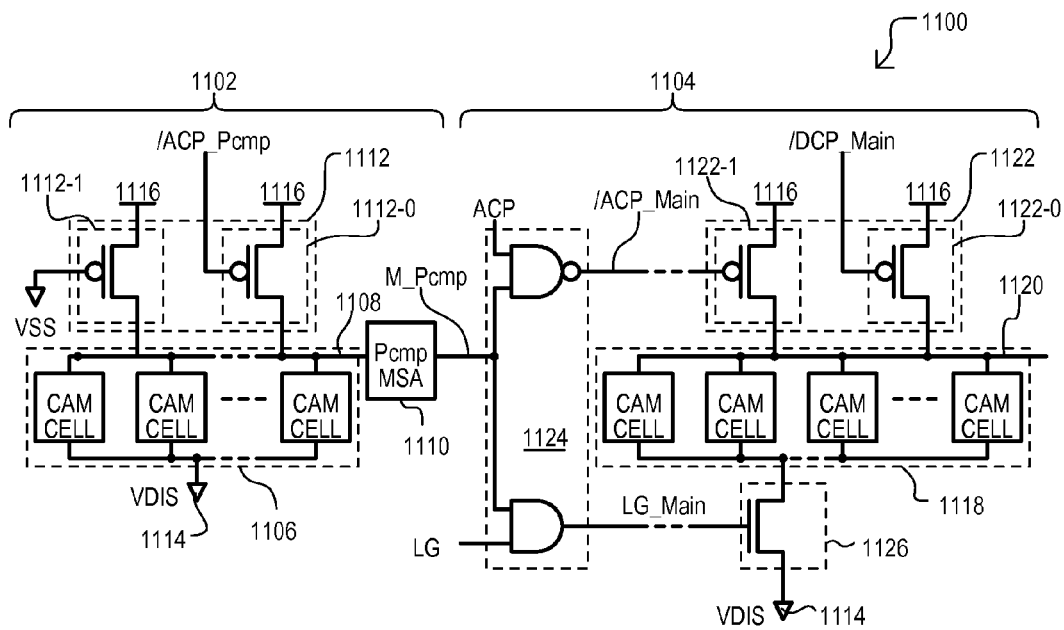
FIG. 11A shows a block schematic diagram of a CAM device according to another embodiment.

Referring now to FIG. 11A, a CAM device according to another embodiment is shown in a block schematic diagram and designated by the general reference character 1100. A CAM device 1100 can include a "pre-compare" section 1102 and a "main" section 1104. A pre-compare section 1102 can generate a pre-compare match result for one portion of a compare data value. A main section 1104 can generate a main match result for another, different portion of the compare data value. If a pre-compare section 1102 does not indicate a match result, a compare operation in the corresponding main section 1104 can be disabled, thereby reducing power.

In the arrangement of FIG. 11A, a pre-compare section 1102 can include a pre-compare group of CAM cells 1106, a pre-compare match line 1108, a match sense amplifier (MSA) 1110, and a pre-compare precharge circuit 1112. CAM cell group 1106 can be arranged in parallel with one another between pre-compare match line 1108 and a reference node 1114.

An MSA 1110 can output a match value M_Pcmp according to a match indication on match line 1108. Thus, match value M_Pcmp can represent a partial compare result for a received compare data value.

A pre-compare precharge circuit 1112 can connect a pre-compare match line 1108 to a precharge node 1116. In the very particular example of FIG. 11, pre-compare precharge circuit 1112 can include a dynamic precharge path 1112-0, and optionally a static precharge path 1112-1. A dynamic precharge path 1112-0 can raise pre-compare match line 1108 to, or toward, a precharge potential in response to a pre-compare control signal /ACP_Pcmp. Optionally, a static precharge path 1112-1 can be included that is "always on", providing a constant path to precharge node 1116. In one particular embodiment, both dynamic and static precharge paths (1112-0 and 1112-0) can include p-channel IGFETs.

Referring still to FIG. 11A, in the arrangement shown, a main compare section 1104 can include a main group of CAM cells 1118, a main match line 1120, a main-precharge circuit 1122, an interlock circuit 1124, and an isolation circuit 1126. Main CAM cell group 1118 can be arranged in parallel with one another between main match line 1120 and isolation circuit 1126. In one very particular example, a main CAM cell group 1118 can include more CAM cells than pre-compare CAM cell group 1106. In such an arrangement, bit values more likely to generate a miss result can be compared in pre-compare section. Therefore, the need to execute compare operations for larger main CAM cell group 1118 can be reduced, further reducing power consumption.

An interlock circuit 1124 can receive a match value M_Pcmp from pre-compare section 1102, a control signal ACP and an isolation signal LG. In response to such input values, interlock circuit 1124 can generate a conditional control signal /ACP_Main and conditional isolation signal LG_Main. More particularly, an interlock circuit 1124 can activate conditional control signal /ACP_Main in response to control signal ACP only if match value M_Pcmp indicates a match has occurred in pre-compare section 1102 (which in this section is when M_Pcmp is a logic high). Similarly, interlock circuit 1124 can activate conditional isolation signal LG_Main in response to isolation signal LG only if match value M_Pcmp indicates a match has occurred in pre-compare section 1102.

A main precharge circuit 1122 can either isolate a main match line 1120 from a precharge voltage, or connect main match line 1120 to the precharge voltage by way of a first main precharge path 1122-0 or second main precharge path 1122-1. A first main precharge path 1122-0 can be enabled in response to conditional control signal /ACP_Main, while second main precharge path 1222-1 can be enabled in response to a second control signal /DCP_Main. In one particular embodiment, both first and second main precharge paths (1112-0 and 1112-0) can include p-channel IGFETs.

An isolation circuit 1126 can either isolate main CAM cell group 1118 from a reference voltage VDIS, or connect such CAM cells to the reference voltage. In FIG. 11A, isolation circuit 1126 can be enabled in response to conditional isolation signal LG_Main. In one particular embodiment, an isolation circuit 1126 can include an n-channel IGFET.

Having described circuit sections for a CAM device 1100 of FIG. 11A, the operation of such a device will now be described with reference to FIG. 11B.

Figure 11B:
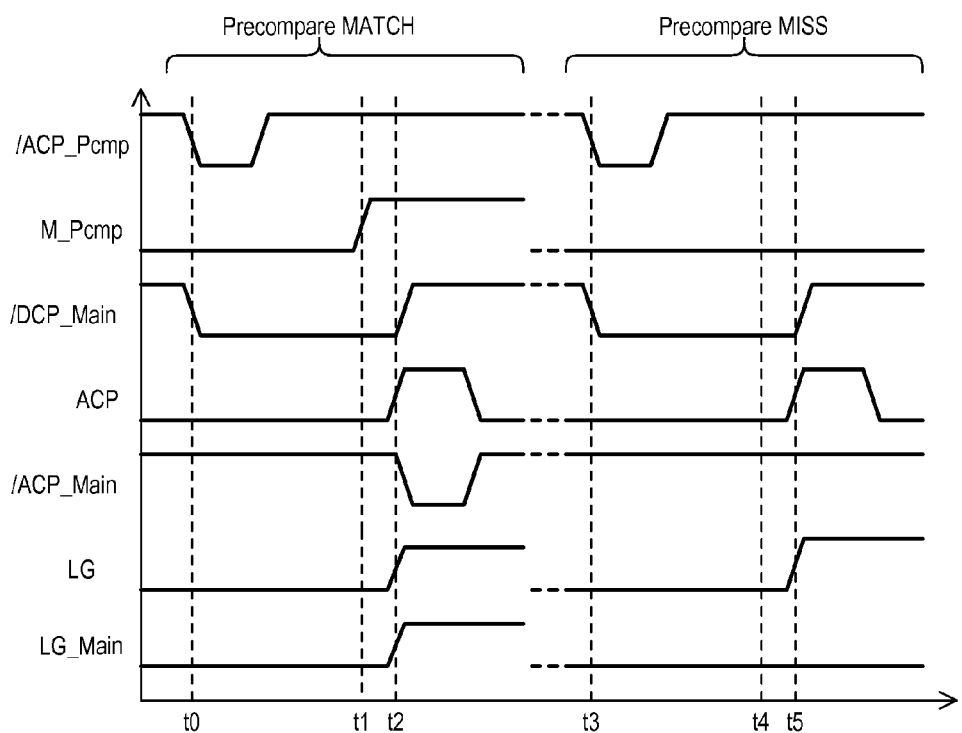
FIG. 11B is a timing diagram showing an operation of the embodiment shown in FIG. 11A.
Figure 12:
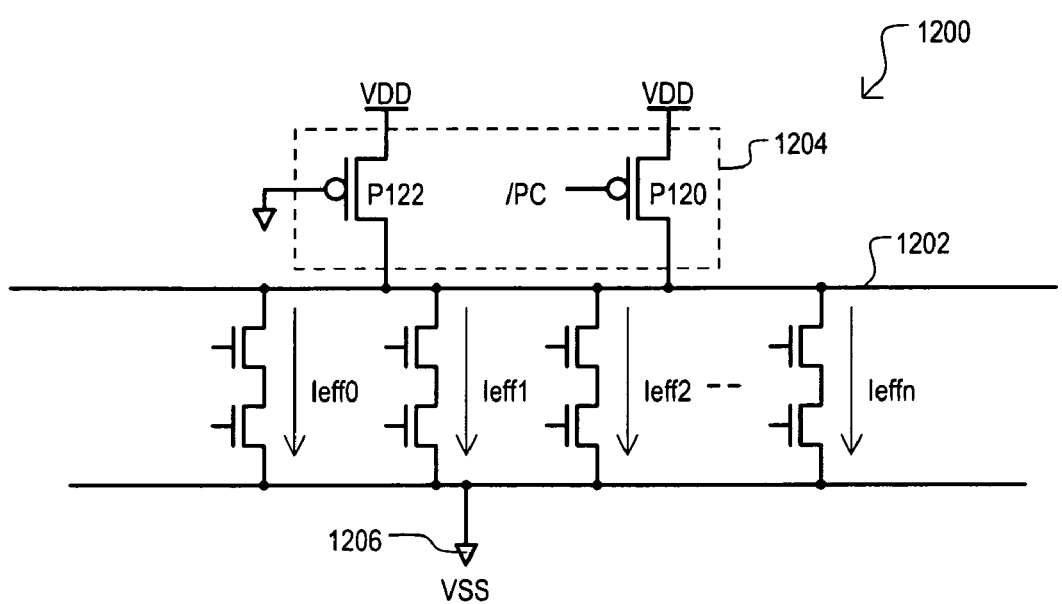
FIG. 12 shows a CAM device match line precharge circuit.

FIG. 11B shows a timing diagram that includes waveforms for various signals of FIG. 11A, including pre-compare control signal /ACP_Main, match value M_Pcmp, second control signal /DCP_Main, control signal ACP, conditional control signal /ACP_Main, isolation signal LG, and conditional isolation signal LG_Main. FIG. 11B shows two types of compare operations: one that generates a pre-compare match result, and one that generates a pre-compare miss result.

Referring now to FIG. 11B in conjunction with FIG. 11A, a pre-compare match result will be described.

Prior to a time t0, pre-compare signal /ACP_Pcmp can be inactive (high). Match value M_Pcmp can be low, indicating that pre-compare match line 1108 does not sense a valid match. Control signal ACP can be inactive. In addition, second control signal /DCP_Main and conditional control signal /ACP_Main can be both be inactive, isolating main word line 1120 from a precharge node 1116. Similarly, conditional control signal LG_Main can be inactive, isolating main CAM cell group 1118 from reference node 1114.

At about time t0, pre-compare control signal /ACP_Pcmp can be activated. As a result, pre-compare match line 1108 can be charged to a precharge voltage. However, valid data has not been received by pre-compare CAM cell group 1106, so match value M_Pcmp can remain low. Within main compare section 1104, first control signal /DCP_Main can be activated at this time, thus second main precharge path 1122-1 can be enabled, connecting main match line 1120 to a precharge node 1116.

In this way, regardless of any result on a pre-compare match line, a precharge operation in a corresponding main match line can begin.

After pre-compare control signal returns to an inactive level, but before time t1, compare data can be applied to pre-compare CAM cell group 1106. In the example shown, such an operation results in pre-compare match line 1108 generating a match result. In response, MSA 1110 can activate match value M_Pcmp at about time t1.

At about time t2, control signal ACP is activated. Because match value M_Pcmp is also active at this time, conditional control signal /ACP_Main can be activated, enabling first main precharge path 1122-0. Similarly, isolation signal LG can be activated at this time. Because match value M_Pcmp is also active, conditional isolation signal LG_Main can be activated, resulting in isolation circuit 1126 connecting main CAM cell group to reference node 1114.

A match or miss indication can then be generated on main match line 1120. Referring still to FIG. 11B in conjunction with FIG. 11A, an operation that includes a pre-compare miss result will now be described.

Prior to a time t3, a CAM device 1100 can have signals at the same levels as time t0. Thus, a CAM device 1100 can be in the same general state.

At about time t3, pre-compare control signal /ACP_Pcmp can be activated as at time t0, with the same results.

After pre-compare control signal /ACP_Pcmp returns to an inactive level but before time t4, compare data can be applied to pre-compare CAM cell group 1106. However, unlike the operation between times t0 and t1, pre-compare match line 1108 generates a miss result. In response, MSA 1110 maintains match value M_Pcmp at the inactive level at time t4.

At about time t5, control signal ACP is activated. However, because match value M_Pcmp is inactive at this time, conditional control signal /ACP_Main and conditional isolation signal LG_Main remain inactive, maintaining main CAM cell group 1118 in a low current leakage state.

In this way, a main match line can be subject to different types of dynamic precharge operations depending upon whether a corresponding pre-compare match line generates a miss result or a match result.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) device, comprising:
   a plurality of match lines each coupled to a plurality of CAM cells that each store data values for comparison with compare data in a compare operation; and
   at least one precharge circuit, each precharge circuit including
      a first precharge path that couples at least one match line to a precharge voltage node in response to at least the activation of a first control signal for and prior to a compare operation, and
      a second precharge path that couples the at least one match line to the precharge voltage node in response to at least the activation of a second control signal, the second control signal being activated after the first control signal and prior to the compare operation;
   wherein the first and second control signals are de-activated prior to the compare operation.

2. The CAM device of claim 1, wherein:
   the first precharge path comprises a first insulated gate field effect transistor (IGFET) having a source-drain path coupled between the at least one match line and the precharge voltage node, and a first channel size; and
   the second precharge device comprises a second IGFET having a source-drain path coupled between the at least one match line and the precharge voltage node, and a second channel size different from the first channel size.

3. The CAM device of claim 1, wherein:
   the first precharge path couples the at least one match line to the precharge voltage node in response to at the activation of the first control signal and a valid indication, the valid indication indicating whether the data values stored by CAM cells connected to the at least one match line store valid data for comparison with compare data.

4. The CAM device of claim 3, wherein:
   the first precharge path comprises
      a first insulated gate field effect transistor (IGFET) having a source-drain path coupled between the at least one match line and the precharge voltage node, and a gate coupled to receive the first control signal, and
      a third IGFET having a source-drain path in series with that of the first IGFET, and a gate coupled to receive the valid indication.

5. The CAM device of claim 3, wherein:
   the first precharge path comprises
      a first insulated gate field effect transistor (IGFET) having a source-drain path coupled between the at least one match line and the precharge voltage node, and
      a logic circuit having at least a first input coupled to receive the first control signal and a second input coupled to receive the valid indication, and an output coupled to a gate of the first IGFET.

6. The CAM device of claim 1, wherein:
the CAM device is coupled to receive a first power supply voltage and a second power supply voltage; and
the first precharge path comprises a first insulated gate field effect transistor (IGFET) having a source-drain path coupled between the at least one match line and the precharge voltage node, and a gate coupled to receive the first control signal, the first control signal having an inactive voltage level outside a range between the first and second power supply voltages.

7. The CAM device of claim 1, wherein:
the plurality of CAM cells are logically arranged into CAM cell groups;
the at least one precharge circuit includes a different precharge circuit coupled between at least one corresponding match line in each CAM cell group and the precharge voltage node; and
each first precharge path couples the corresponding match line to the precharge voltage node in response to the activation of the first control signal and a group select signal, the group select signal indicating if a compare operation is to be executed on the CAM cell group of the corresponding match line.

8. The CAM device of claim 1, wherein:
the CAM cells are logically arranged into words, each word including a first set of CAM cells coupled to a pre-compare match line, and a second set of CAM cells coupled to a main match line;
a pre-compare precharge circuit that couples at least one pre-compare match line to the precharge voltage node in response to a pre-compare control signal activated prior to the first control signal in a compare operation; and
the at least one precharge circuit includes the first precharge path and second precharge path being coupled between the precharge voltage node and the main match line of the same word as the at least one pre-compare match line.

9. The CAM device of claim 1, further including:
an isolation circuit that couples the CAM cells to a reference node in response to the activation of an isolation control signal.

10. The CAM device of claim 9, wherein:
the isolation circuit comprises an isolation IGFET having a source-drain path coupled between the CAM cells and the reference node, the reference node being a power supply node.

11. A method of isolating current paths through memory cells in a CAM device, comprising the steps of:
essentially isolating at least one match line from a precharge voltage node prior to receiving command data, the match line being coupled to a plurality of CAM cells, each CAM cell having compare circuits that compare a stored data value to a received compare data value;
coupling the match line to the precharge voltage node by enabling a primary precharge path in response to at least predetermined command data; and
coupling the match line to the precharge voltage node by enabling a secondary precharge path prior to enabling the primary precharge path; wherein
the CAM device is divided into a plurality of blocks separately selectable according to a received block select value, and the secondary precharge path is enabled in response to the predetermined command data and a block select value.

12. The method of claim 11, further including:
the secondary precharge path is enabled in response to the predetermined command data and a validity data value corresponding to the CAM cells.

13. The method of claim 11, wherein:
the secondary precharge path is enabled in response to a periodic timing signal.

14. The method of claim 11, further including:
coupling a pre-compare match line corresponding to the at least one match line to the precharge voltage node;
generating a match indication on the pre-compare match line according to a comparison between data stored in CAM cells coupled to the pre-compare match line and received compare data;
the primary precharge path is enabled in response to the predetermined command data and the match indication.

15. The method of claim 14, wherein:
the secondary precharge path is enabled irrespective of the match indication.

16. The method of claim 11, further including:
the isolating the plurality of CAM cells from a reference node prior to receiving command data, the CAM cells being arranged in parallel with one another between the at least one match line and the reference node; and
coupling the CAM cells to the reference node in response to at least predetermined command data.

* * * * *